United States Patent [19]

Reed et al.

[11] 4,216,019
[45] Aug. 5, 1980

[54] PHOTOGRAPHICALLY PRODUCED STENCILS

[75] Inventors: Kenneth J. Reed, Deer Park Rd., Wimbledon, London SW19, England; Alan L. Lythgoe, London, England

[73] Assignee: Kenneth James Reed, London, England

[21] Appl. No.: 925,884

[22] Filed: Jul. 18, 1978

[30] Foreign Application Priority Data

Jul. 21, 1977 [GB] United Kingdom ............... 30750/77

[51] Int. Cl.² ........................... G03C 5/00; B41N 1/24
[52] U.S. Cl. .................................. 430/308; 101/128.4; 427/143; 430/252; 430/263
[58] Field of Search .................... 96/36.4, 116, 45, 67, 96/28, 83; 101/128.3; 427/143

[56] References Cited

U.S. PATENT DOCUMENTS

| | | | |
|---|---|---|---|
| 2,969,731 | 1/1961 | Kendall | 96/36.4 X |
| 3,532,052 | 10/1970 | Erickson | 101/128.3 |
| 4,076,535 | 2/1978 | Putten | 96/67 |
| 4,093,464 | 6/1978 | Ruckert et al. | 96/36.4 X |

FOREIGN PATENT DOCUMENTS

| | | |
|---|---|---|
| 618181 | 2/1949 | United Kingdom . |
| 888935 | 2/1962 | United Kingdom . |
| 1265256 | 3/1972 | United Kingdom . |

*Primary Examiner*—Edward C. Kimlin
*Attorney, Agent, or Firm*—Cushman, Darby & Cushman

[57] ABSTRACT

There is provided a method for producing a stencil for use in screen printing which method comprises coating a screen mesh with liquid photopolymerizable composition, imagewise exposing the coated mesh to radiation to polymerize liquid composition on the mesh in the exposed areas, and removing unexposed liquid composition from the mesh to develop the stencil. Suitably the liquid composition is applied with the screen mesh in contact with a protective film and, after imagewise exposure, the stencil is developed by stripping of the film such that unexposed liquid remains on the film. This provides a simple method of producing a stencil which does not require highly skilled personnel.

12 Claims, 2 Drawing Figures

PHOTOGRAPHICALLY PRODUCED STENCILS

BACKGROUND OF THE INVENTION

This invention relates to photographically produced stencils for use in screen printing (herein, for the sake of brevity, referred to as photostencils).

In screen printing the image to be printed is defined by masking off whole or part apertures of a screen printing mesh with stencil material. Thus, during printing, this stencil material prevents the passage of screen printing ink through the masked areas.

Although such stencils may be produced manually it is normal practice to produce them photographically. The production of such a photostencil requires the preparation of a dry water-soluble photosensitive polymer layer which, on imagewise exposure to suitable illumination, is made water-insoluble in the exposed areas such that the layer material may be washed away with cold or warm water in the unexposed areas to produce a photostencil. Such photosensitive layers used in screen printing have in practice been generally based on polyvinyl alcohol, polyvinyl alcohol—polyvinyl acetate mixtures, or gelatin, sensitised by a water-soluble dichromate salt, a diazonium salt or a ferric salt.

Two different methods have been used for applying the photostencil to the screen mesh; these are termed the direct and indirect methods. In the direct method, an aqueous solution of polyvinyl alcohol, usually mixed with polyvinyl acetate aqueous emulsion and containing the sensitiser, to give about 10-30% by volume of non-volatile material, is coated as a viscous liquid onto the tensioned screen mesh and dried by evaporation. Since substantial contraction of the layer thickness occurs on drying, several coats are generally applied, each with intermediate drying, to build up sufficient dry layer thickness to provide a photostencil with adequate mechanical strength. The dry sensitized mesh is then exposed by contact to a high contrast photographic positive in a vacuum frame to obtain close contact with the positive. The exposing radiation may be mercury metal halide, mercury vapour, pulsed xenon or carbon arc radiation, all of which have high intensity in the range 350-450 nm to which the sensitised polymer is most sensitive. The image is developed by carefully washing out the unexposed polymer with cold or warm water, and the remaining polymer is then dried again to form the photostencil.

In the indirect method, an aqueous solution of sensitised polymer, usually at 10-25% concentration by volume, is coated as a thick layer onto a colourless transparent film base, such as polyester film, which may be coated to facilitate subsequent dry stripping. After a long drying stage in a complex drying tunnel, the dry polymer layer is exposed to a high contrast photographic positive in a vacuum frame using the same illumination as in the direct method. The image is developed usually by washing out the soluble, unexposed polymer with cold or warm water and, while wet, the remaining polymer, still on the film base, is applied under light pressure to the screen mesh and dried in situ. Finally the film base is stripped off to leave the printing stencil on the mesh.

The direct and indirect methods for producing photostencils both therefore require at least two lengthy drying stages under carefully controlled conditions to avoid drying defects and dust contamination. Also the final stencil is not resistant to water-based screen inks nor to many inks containing organic solvents with hydroxyl groups. Water-based screen inks are widely used in textile printing on both flat and cylindrical screens and then the stencil must be hardened chemically or protected by baking on a protective lacquer.

Moreover, in the direct method, the evaporation of water during the first drying stage may cause shrinkage and loss of image quality; particularly the formation of saw-tooth edges due to defective bridging of mesh apertures. Multiple coats with intermediate drying are generally used to reduce this effect, but limited print detail resolution is still obtained in the direct method. The indirect method also suffers from some print quality loss due to shrinkage but the main problem is one of poor adhesion since the stencil is applied to the mesh in a swollen but not liquid condition and thus does not encapsulate the mesh. Both polyvinyl alcohol and gelatin have poor specific adhesion to polyester monofilament mesh which is the most widely used mesh in screen printing.

DETAILED DESCRIPTION OF THE INVENTION

According to the present invention, there is provided a method for producing a stencil for use in screen printing which method comprises coating a screen mesh with liquid photopolymerisable composition, imagewise exposing the coated mesh to radiation to polymerise liquid composition on the mesh in the exposed areas, and removing unexposed liquid composition from the mesh to develop the stencil.

With the method of the invention, photostencils of high quality can be prepared quickly with simple equipment requiring minimal skill, and without producing liquid effluent or requiring possible hazardous chemicals, such as dichromate and diazonium salts to be used. Another important advantage of the present method is that there is no need to carry out a drying stage in the preparation of the photo-sensitive layer since the preferred photopolymerisable liquids are substantially non-volatile. Adequate layer thickness can therefore be obtained in a single coating operation. This contrasts with prior art methods in which a screen mesh coated with e.g. a sensitised polyvinyl alcohol solution cannot be used to produce a photostencil by exposure before drying (i.e. while in the wet, liquid state) because a water-insoluble exposed layer which adheres to the mesh is not obtained. Exposure and water-development is only possible after drying the coated mesh.

There are a number of methods by which the stencil may be developed according to the invention, i.e. the unexposed liquid composition removed, including dissolution by applying a solvent to wash away the unexposed liquid, or dispersion by spraying with water and a surface active agent to disperse the unexposed liquid. Further the liquid composition may adhere by surface tension to the screen mesh without the need for support.

However, according to a preferred embodiment of the invention, one side of the screen mesh (that is the printing side) is in contact with a radiation transmitting sheet material, liquid photopolymerisable composition is applied to the other side of the mesh, imagewise exposure is made through the sheet material and the stencil is developed by separating the sheet material and mesh so that unexposed liquid composition remains on the sheet material. The radiation transmitting sheet, termed a protective film, may be a plastics film for example, a clear polyester or polypropylene film, or glass.

The coated screen mesh may be exposed to projected radiation or by contact between a photographic positive and the protective film in a printing frame. In the latter case, the protective film prevents contact of the positive with the liquid. After exposure, the protective film is simply stripped away to develop the stencil. Most of the unexposed liquid will adhere to the film and be removed with it. The coated screen mesh may be exposed by direct contact with the photographic positive, which is then stripped off to develop the stencil if the positive is of suitable material.

After stripping, the mesh apertures in the printing (unexposed) areas are substantially open and the screen may therefore be used for immediate printing. A thin film of liquid composition is usually left on the surface of the mesh filaments, as in normal screen printing when the screen is opened, but this thin film will dissolve or disperse into the screen ink during the first few prints. Alternatively, the thin liquid film on the mesh filaments can be removed by applying a solvent or dispersant for the liquid prior to printing. Another alternative is to re-expose the mesh to uniform radiation to polymerise the liquid and therefore fix the residual liquid onto the mesh filaments. This fixing technique is of value when it is required slightly to reduce the mesh apertures and so reduce the quantity of ink applied by the screen. The fixing technique also increases the strength of the photostencil by reinforcing the edges of the photostencil image.

A further important advantage of using a protective film and development by stripping is that a proof of the stencil is produced on the film. The photopolymerisable liquid may be coloured with pigments or soluble dyes to aid inspection of the mesh coating operation and inspection of the derived photostencil. Consequently after stripping, the liquid print on the film is similarly coloured and clearly visible. This liquid print may be polymerised by exposure to the uniform radiation to give a true proof of the photostencil which is a facsimile of the print that will be obtained by printing the stencil.

By using appropriately coloured, namely yellow, magenta, cyan and black, photopolymerisable liquids, a set of colour proofs may be obtained from four such photostencils as used for four colour half-tone printing, which proofs can be superimposed on each other to show colour progressives and the final full colour result. These are of great value to the printer to control colour printing densities.

When exposing by contact with a positive in a vacuum frame a second similar protective film can be placed on the upper mesh surface to prevent contact of the rubber blanket of the frame with the photopolymerisable liquid in the mesh apertures. Both protective films may be removed by stripping for development. Alternatively, or additionally, a fine powder such as silica aerogel or talc can be applied to the upper mesh surface to avoid contamination of the rubber blanket.

The present method may be used in conjunction with all types of screen mesh including mono- and multi-filament polyester, polyamide, stainless steel, phosphor bronze, nickel, silk and organdle (cotton) meshes. The mesh may be a woven, knitted or non-woven mesh, or may be of a perforated metal or plastics material, or may be a mesh electroformed or formed by etching. Photostencils on both flat screens and cylindrical screens can be produced by the present method and the conventional screen printing methods of the prior art may also be used.

The photopolymerisable liquid compositions are polymerised on the mesh to the solid state by exposure to suitable radiation e.g. ultraviolet or visible light or a mixture thereof. Generally, sensitivity to visible light and near ultraviolet is preferred since this light is readily generated by mercury vapour lamps, mercury metal halide, pulsed xenon and carbon arcs, and is relatively safe to use.

By suitable selection of components of the liquid photopolymerisable composition and its layer thickness, high adhesion to the screen mesh to give photostencils suitable for long run printing are readily achieved. Photostencil thickness can be readily controlled over wide limits by controlling the thickness of the liquid photopolymerisable layer applied to the mesh. When the mesh is encapsulated by photopolymerised material a very high strength photostencil is obtained assisted by mechanical adhesion. Since there need be no drying of the liquid photopolymerisable layer according to the present method, there is negligible contraction of the original layer. The liquid layer can be coated flush with both mesh surfaces, lower than the mesh surfaces or coated proud of one or both mesh surfaces depending on the coating technique used. High adhesion of the photostencil to the mesh can be obtained by the use of particular photopolymerisable compositions particularly acrylated urethanes and compositions giving a flexible photostencil of high tensile strength by control of cross-link density.

Photopolymerisable liquid compositions used according to the present invention preferably comprise ethylenically unsaturated monomers or prepolymers or mixtures thereof. An ethylenically unsaturated prepolymer contains a polymeric component in the molecule. It is very desirable to use fast photopolymerising materials to reduce the exposure time to the radiation.

Fast photopolymerisation may be obtained by photo-initiated vinyl addition polymerisation of monomers and prepolymers containing terminal or pendant acryloyl or methacryloyl groups: $CH_2=CR-CO-$ where R is H or $CH_3-$ respectively. The acryloyl group is faster polymerising than the methacryloyl group and reference below to acryloyl groups includes methacryloyl groups.

To obtain good coating properties, the liquid photopolymerisable composition must possess a suitable viscosity which is generally in the range of 2 to 50, more usually 10 to 30, poises and this can be readily controlled by the molecular weight and composition of the photopolymerisable materials. Conveniently a prepolymer of high viscosity is used in admixture with a monomer of low viscosity to give precise control of viscosity.

Low viscosity and liquid photopolymerisable materials are monomers, that is materials which do not contain polymeric groups in the molecule and suitable materials are esters of acrylic or methacrylic acid and a mono- or poly-hydric alcohol, particularly acrylate esters of mono, di, tri and tetra-hydric alcohols. Monomers are preferred which have very low volatility and low skin and eye irritancy and these properties are generally obtained with monomers of higher molecular weight. Acrylate esters of the following alcohols are suitable and are given by way of example:

Monohydric alcohols: 2 phenoxyethanol, 2-phenoxyethoxyethanol and hydrogenated derivatives thereof.

Dihydric alcohols: tripropylene glycol, bisphenol A, hydrogenated bisphenol A and hydroxyethyl ethers and hydroxypolyethoxy and propoxy ethers of bisphenol A and hydrogenated bisphenol A.

Trihydric alcohols: trimethylolpropane
Tetrahydric alcohols: pentaerythritol
Polyhydric alcohols: dipentaerythritol All hydroxyl groups may be esterfied or one or more groups may be left unesterfied and free hydroxyl groups may be further reacted or partially reacted with mono, di or tri- isocyanates to produce urethanes.

High viscosity is readily obtained by photopolymerisable prepolymers which range from highly viscous liquids to solids and have molecular weight range of about 250-5000. The terminal or pendant acryloyl groups can be incorporated in polymeric components such as polyurethane, polyepoxide, polyether, polyester and polyaminoformaldehyde polymers.

Generally 2-9, and preferably 2-4 acryloyl groups are incorporated in the polymer molecule and this can be carried out for example by reacting acrylic acid or acryloyl chloride with a polymer or polymerisable material containing free hydroxyl groups. Alternatively such groups can be incorporated by reaction of a hydroxyalkyl acrylate with a polymer or polymerisable material containing isocyanate, epoxide, carboxylic acid, anhydride or aminoformaldehyde groups.

For example an acrylated epoxy prepolymer is prepared by reacting bisphenol A polyglycidyl ether with terminal epoxide groups with acrylic acid which open the oxirane ring and the hydroxyl groups so produced can be further reacted with acryloyl chloride to introduce additional acryloyl groups.

Acrylated urethane prepolymers are prepared for example by reacting hydroxyethyl or hydroxypropyl acrylate with hexamethylene di-isocyanate, other di- or polyisocyanates and the terminal isocyanate groups are then reacted further with hydroxyl containing polyethers or polyesters.

Alternatively acryloyl polyether urethanes and acryloyl polyester urethanes may be prepared by reacting an excess of a di- or polyisocyanate with a polyether or polyester having free hydroxyl groups and then reacting this polymer with a hydroxyalkyl acrylate.

To obtain the correct balance of properties more than one monomer and more than one prepolymer may be used in the liquid photopolymerisable composition. Also one or more photoinitiators are dissolved or dispersed in the composition at a concentration of 0.01 to 30% and more usually 1 to 10% by weight based on the weight of unsaturated material, to photoinitiate polymerisation. The following are examples of photoinitiators: Ketones and derivatives such as benzophenone, 4, 4'-dimethyl-aminobenzophenone, acetophenone, 2,2-diethoxyacetophone, halogenated benzophenone, benzil, benzil dimethyl acetal. Acryloins and derivatives such as benzoin, benzil dimethylacetate and benzoin isopropyl ether. Thio compounds such as thioxanthone, 2-chlorothioxanthone, benzoyl diphenyl sulphide, polynuclear quinones and derivatives such as benzoquinone, chloroanthraquinone. Chlorinated hydrocarbons such as hexachlorethane and diazo compounds including fluoroborate salts of diazonium compounds.

The effect of photoinitiators may be accelerated by inclusion of a tertiary amine such as ethyl dimethylaminobenzoate or an amino acrylate polymer.

Other types of unsaturated monomers and polymers can be added to the main photopolymerisable materials listed above to participate in the photopolymerisation such as N-vinylpyrrolidone, vinyl acetate, allyl and cinnamyl esters, acrylamide derivatives such as (N-isobutoxymethyl) acrylamide, triallylcyanurate. Unsaturated polyesters include maleate, fumarate, itaconate and citraconate esters of glycols.

Non-reactive polymers can also be dissolved or dispersed in the main photopolymerisable materials such as a high acid value polyester to give alkali solubility to the photopolymerised photostencil or dispersed finely powdered polyvinylchloride or vinyl chloride-acetate copolymer which solvate during photopolymerisation to increase film strength and flexibility.

Finally various other additives may be added to the photopolymerisable composition such as pigments, fillers, flow agents and waxes.

Photopolymerisation can be subject to inhibition by atmospheric oxygen which effects mainly the outer surface of the layer. This can lead to a reduction in film strength and oxygen inhibition may be prevented in the invention by the use of the protective film over the liquid composition during exposure, which reduces access by atmospheric oxygen.

A number of photostencil properties are affected by the crosslink density including solvent resistance, flexibility, tensile strength and Young's modulus.

Crosslink density is mainly determined by the number of photopolymerisable ethylenically unsaturated groups per molecule of the materials used in the liquid compositions, termed the "functionality". One ethylenic group per molecule cannot crosslink and gives a soft and very extensible photostencil. Two ethylenic groups per molecule generally give a flexible and strong photostencil and three ethylenic groups give high Young's modulus values which may lead to an inflexible stencil. A mixture of materials with one, two and three ethylenic groups is a useful means of achieving crosslink density which will then be an average value.

Flexibility is also achieved by using flexible chemical groups in the photopolymerisable materials such as long alkyl chains, polyether and polyester groups, combined with control of the crosslink density.

Generally di-functional materials, that is materials containing two acryloyl groups per molecule, provide the best balance of properties. A mixture of mono-acrylate and tri-acrylate or higher acrylate materials is an alternative means of controlling crosslink density. In such a mixture the unsaturated monomer, prepolymer or mixture thereof should preferably contain an average of 2 to 3 acryloyl groups per molecule. Generally a flexible stencil provides the highest adhesion and is used in general screen printing and higher modulus values are useful for improving dimensional stability in cylindrical printing screens.

It is desirable to some screen printing work to reclaim the screen after printing has been completed by removal of the photostencil from the mesh. This can be achieved in the present invention by several methods. A non-photopolymerisable material can be incorporated in the liquid composition which has specific solubility properties. For example, a low molecular weight polymer having a high acid value due to a high content of carboxylic acid groups, such as polyvinyl phthalate or mellitic anhydride glycerol polyester, may be dissolved in the photopolymerisable liquid composition to render the photopolymer formed on the mesh soluble or dispersible in aqueous alkali. Alternatively, or in addition, a photopolymerisable high acid value material such as acrylic acid may be incorporated in the photopolymerisable liquid to give alkali solubility.

The use of predominantly di-functional materials such as di-acrylate monomers and di-acrylate prepolymers to control cross-link density produces a photopolymerised stencil which is soluble or softenable in specific organic solvents such as methyl pyrrolidone and ketones. Removal of the softened photostencil from the mesh can then be carried out with high pressure water spray of 500 or 1000 psi.

The present invention also provides stencils for use in screen printing produced by the present method.

The invention further provides a process of screen printing which process comprises passing screen printing ink through such a stencil on to a substrate.

The invention is schematically illustrated by way of example in the accompanying drawings.

DETAILED DESCRIPTION OF THE INVENTION

Figure 1:
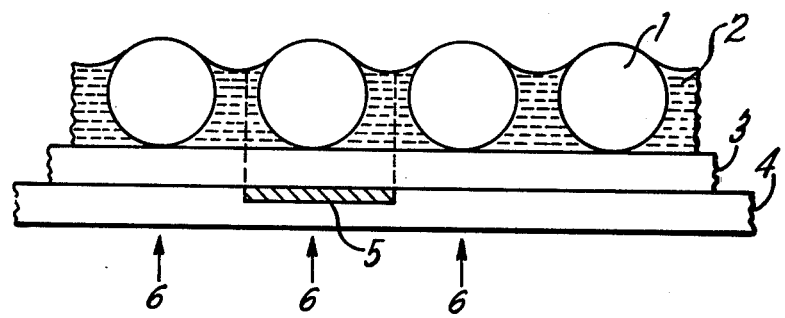
FIG. 1 is an enlarged section view of an unexposed coated mesh stencil for use in screen printing.

FIG. 1 shows an enlarged section through a monofilament mesh 1 which has been coated with the photopolymerisable liquid 2 against a transparent plastics film 3. A photographic positive 4 bearing a high density image 5 has been placed in contact with the coated mesh for exposure by radiation 6 which causes photopolymerisation of the liquid.

Figure 2:
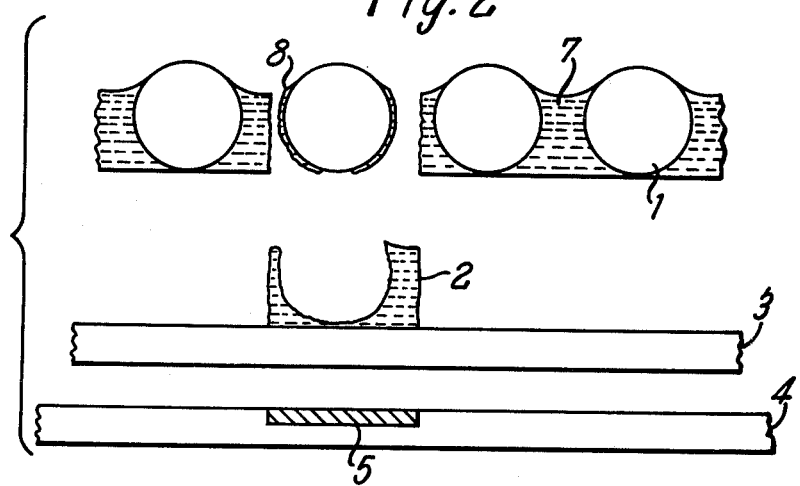
FIG. 2 illustrates the development of the exposed mesh stencil of FIG. 1.

FIG. 2 shows the development of the exposed mesh of FIG. 1 in which the exposed material has been converted to the solid state and retained in the mesh to form the photostencil 7 while most of the unexposed liquid 2 has been removed with the plastics film 3. A thin layer of unexposed liquid 8 may remain on the mesh surface and may be removed by cleaning with a solvent or dispersant or screen removed in the first few prints by the passage of ink through the mesh. Alternatively liquid 8 may be photopolymerised on the mesh to reduce the open area of the mesh by exposure of the mesh to uniform radiation.

The invention is further illustrated in the following Examples.

EXAMPLE 1

A foam rubber sheet of 3 mm thickness is placed on a flat table support and a clear transparent polyester film of 50 μm thickness is placed on top as protective film. A printing screen having a tensioned polyester mesh of 120 meshes per centimeter with filament diameter 40 μm and plain weave, is placed on the film with the underside (printing side) of the screen in contact with the polyester film.

A trichromatic blue photopolymerisable liquid of the following composition (parts by weight)

| | | |
|---|---|---|
| 1. | Acrylated urethane | 65.08 |
| 2. | Trimethylolpropane triacrylate | 12.6 |
| 3. | Phenoxyethyl acrylate | 18.0 |
| 4. | Dimethoxyphenylacetophenone | 3.6 |
| 5. | 4,4'-Dimethylaminobenzophenone | 0.27 |
| 6. | Phthalocyanine blue pigment | 0.45 |
| | | 100.00 |

(ingredient 1 is obtained by reaction of hydroxyethyl acrylate with hexamethylene di-isocyanate and reaction of the terminal isocyanate groups obtained with a hydroxyl-containing polyester, and ingredients 4 and 5 are photoinitiators) is coated on the exposed mesh surface by drawing a bead of liquid slowly across the screen with a sharp hard rubber squeegee. The mesh apertures are completely filled with liquid and the liquid is cleanly sheared level with the mesh surface to give an exact and uniform coating weight controlled by the physical measurements of the mesh. If entrapped air should occur in the coating, the coating operation is carried out with the flat table surface inclined upwards or even vertically and coating commenced from the bottom. Several squeegee strokes can also be carried out to expel air.

The screen is exposed for 6 minutes to a projected photographic image of high contrast using as a light source a 2 kw mercury metal halide lamp having peak radiation in the 400–450 nm band.

Alternatively, the high contrast photographic halftone positive is placed in contact with the protective film and the assembly placed in a vacuum exposure frame. A second protective polyester film is placed on the top mesh surface. The screen is exposed under vacuum to a mercury halide lamp of 2 kw at a distance of 1 meter for 4.5 minutes and the screen removed from the vacuum frame.

Both polyester films are then stripped off the mesh. In the black opaque regions of the photographic positive, where no light falls on the sensitised screen, the composition remains liquid and is removed with the polyester films giving a positive working process. The polyester film thus carries a finely detailed blue image. The image on the polyester film from the lower mesh surface is re-exposed to the same light source, without the photo photographic positive, for 4 minutes which converts the liquid to a hard layer with excellent adhesion to the polyester film and which forms an excellent proof of the photostencil.

The use of the cyan pigment provides a colour proof suitable for the cyan printer of a trichromatic or four colour half-tone set and additionally forms a very clearly visible photostencil on the screen mesh. Yellow, magenta and black pigments or soluble dyes may be used in the photopolymerisable liquid instead of the cyan pigment when the photostencils for the other colours of the four colour half-tone set are produced.

Any blue liquid remaining on the surface of the mesh filaments after stripping can be removed by washing the screen with isopropanol but it is preferred to use the screen directly for printing. The first print will clean the filaments of the liquid film.

Instead of using the polyester protective film on the underside of the mesh, the photographic positive can be used instead and after stripping the liquid composition removed with solvent such as 2-ethoxyethanol which does not damage the positive.

EXAMPLE 2

The screen printing mesh of Example 1 dyed to an intense yellow colour by a yellow disperse dye, is tensioned and fixed to the screen frame. A photostencil is prepared by the method described in Example 1, except that exposure is increased by 50% to compensate for light absorption by the yellow mesh.

The proof on the polyester film is found to have improved detail in the highlight dots and in fine line detail due to a reduction in light scatter by the mesh, the yellow colour strongly absorbing actinic light scattered by the mesh.

EXAMPLE 3

A monofilament polyester mesh having 90 mesh/cm of 40 μm filament diameter and dyed yellow, is tensioned and fixed to a screen frame and coated with the photopolymerisable liquid of the following composition (parts by weight)
1. Mellitic anhydride-glycerol polymer: 19.00
2. Trimethylolpropane triacrylate: 12.6
3. Acrylated urethane (as in Example 1): 33.4
4. Tetraethylene glycol diacrylate: 5.4
5. Talc: 19.0
6. Modaflow (Trade name of Monsanto): 0.8
7. Phenoxyethyl acrylate: 5.4
8. 4,4'-Dimethylaminobenzophenone: 0.3
9. Di-methoxyphenylacetophenone: 3.0
10. Benzophenone: 0.5

(Ingredient 1 is a very high acid value polyester which confers solubility in aqueous alkali. Ingredient 5 is an extender for giving good rheology during coating and stripping. Ingredient 6 prevents foaming during stripping. Ingredients 7, 8, 9 and 10 are photoinitiators).

During coating, the liquid is contained in a coating tray and the screen coated while supported in a nearly vertical position. The coating try has a doctor blade with a 45° trailing angle to the mesh and a coating edge radius of 2.0 mm. A single coating is applied to the print side of the mesh. The viscosity of the liquid is approximately 25 poise with a high yield value so that the liquid does not run or sag after coating when the screen is maintained in a vertical position during light exposure. Coating is carried out on the printing side (underside) of the screen and after coating a completely smooth, uniform, layer of photosensitive liquid approximately 5 μm thick, remains above the printing surface of the mesh as well as completely filling the mesh apertures. This layer of liquid provides a thicker photostencil of increased strength and gives particularly good print quality for line photostencils.

The screen is exposed for 3 minutes to a high contrast projected photographic image using a 5 kw metal mercury halide lamp and condenser lens to concentrate the liquid from the lamp onto the small 15×10 cm photographic positive which is projected with a high aperture process lens.

After exposure the stencil is developed by pressing a sheet of smooth absorbent cast-coated paper in contact with the printing side of the mesh using a roller and then stripping off the paper. Alternatively, the image is developed by applying β-butoxyethanol solvent with a soft sponge to wash away the unexposed liquid or by simply printing the screen with solvent-based ink.

A good photostencil is produced which is resistant to many types of screen inks including water-based screen inks, solvent-based inks based on aromatic and aliphatic hydrocarbon solvents, and ultra-violet curing screen inks.

The photostencil is removed after use by cleaning with solvent to remove residual ink and then application of 2% aqueous caustic soda followed by high pressure water spray.

EXAMPLE 4

A screen frame with the tensioned monofilament polyester mesh of Example 1 was placed on the clear polyester protective film of Example 1 or the glass sheet of a vacuum exposure frame, and the following composition is coated over the top mesh surface using a sharp, hard rubber squeegee (parts by weight):

| 1. | Di-acrylate ester of the bis-hydroxyethylether of bisphenol A | 90 |
| 2. | Reaction product of Pentaerythritol di-acrylate and hexamethylene di-isocyante | 5 |
| 3. | Benzil | 2 |
| 4. | 4,4'-Dimethylaminobenzophenone | 3 |
|    |                                                              | 100 |

[Item 1 is a di-functional acrylated liquid monomer and Item 2 is an acrylated urethane prepolymer having four acrylate groups per molecule. Items 3 and 4 are photoinitiators.] The composition has a viscosity of 15–20 poises.

A second clear polyester protective film was placed on the top mesh surface.

The high contrast photographic positive is placed with its emulsion side in contact with the protective film on the lower mesh surface and exposed in a vacuum printing frame to a 2 kw mercury metal halide lamp peaking at 400–450 nm, for 3 minutes. The upper protective film was stripped off and discarded and the lower protective film was stripped off to develop the photostencil.

When printed with a solvent-based screen ink containing 2-ethoxyethanol as solvent, residual liquid photopolymerisable material on the mesh threads was removed with the first few prints.

We claim:
1. A method for producing a stencil for use in screen printing which method comprises the successive steps of:
    (a) providing a screen mesh supported under tension;
    (b) placing a radiation-transmitting sheet material adjacent or in contact with one surface of the mesh;
    (c) applying a liquid photopolymizable composition to one surface of the mesh while the other surface of the mesh is in contact with a radiation transmitting sheet material such that the mesh apertures are substantially filled with said liquid composition;
    (d) imagewise exposing the mesh coated with the liquid composition to radiation through the said sheet material to polymerize the composition on the mesh in the exposed areas, and
    (e) separating the sheet material from the mesh substantially to remove any of said liquid composition remaining in the unexposed areas with the sheet material while the polymerized composition remains on the mesh in the exposed areas to form the stencil for use in screen printing.

2. A method according to claim 1 in which the radiation transmitting sheet material has radiation non-transmitting areas therein to provide imagewise exposure when subjected to uniform radiation.

3. A method according to claim 1 in which the liquid composition is colored so that liquid remaining on the sheet material after the separation from the mesh forms a proof of the stencil, which proof may be polymerized by exposure to radiation.

4. A method according to claim 1 in which residual unexposed liquid composition remaining on the mesh after removal of the sheet material is removed by washing with solvent or dispersant for the composition.

5. A method according to claim 1 in which residual unexposed liquid composition remaining on the mesh after removal of the sheet material is left on the mesh to be removed during use of the stencil by printing with an ink which dissolves or disperses the liquid composition.

6. A method according to claim 1 in which the liquid composition has a viscosity of 2 to 50 poises.

7. A method according to claim 1 in which the liquid composition comprises a photopolymerisable ethylenically unsaturated monomer or prepolymer or a mixture thereof.

8. A method according to claim 5 in which the unsaturated monomer or prepolymer contains pendant or terminal acryloyl or methacryloyl groups.

9. A method according to claim 8 in which the major proportion of unsaturated monomer or prepolymer in the liquid composition contains 2 acryloyl groups per molecule.

10. A method according to claim 8 in which the unsaturated monomer, prepolymer or mixture thereof contains an average of 2 to 3 acryloyl groups per molecule.

11. A method according to claim 1 in which the liquid composition comprises an ester of acrylic or methacrylic acid and a mono- or poly-hydric alcohol.

12. A method according to claim 1 in which the liquid composition contains a photoinitiator to increase the rate of photopolymerisation of the composition to ultraviolet or visible light or a mixture thereof and the coated mesh is imagewise exposed to ultraviolet or visible light or to a mixture thereof.

* * * * *